United States Patent [19]

Arikawa et al.

[11] Patent Number: 5,493,153
[45] Date of Patent: Feb. 20, 1996

[54] PLASTIC-PACKAGED SEMICONDUCTOR DEVICE HAVING A HEAT SINK MATCHED WITH A PLASTIC PACKAGE

[75] Inventors: Tadashi Arikawa; Mitsuru Tsuchiya; Akira Ichida; Tadashi Igarashi, all of Toyama, Japan

[73] Assignee: Tokyo Tungsten Co., Ltd., Tokyo, Japan

[21] Appl. No.: 157,295

[22] Filed: Nov. 26, 1993

[30] Foreign Application Priority Data

Nov. 26, 1992 [JP] Japan .................................. 4-316765
Mar. 11, 1993 [JP] Japan .................................. 5-050983
Jun. 10, 1993 [JP] Japan .................................. 5-163777
Nov. 9, 1993 [JP] Japan .................................. 5-302210

[51] Int. Cl.$^6$ ............................ H01L 23/34; H01L 23/28; H05K 7/20
[52] U.S. Cl. ............................ 257/796; 257/713; 257/720; 361/704; 361/707; 361/712
[58] Field of Search .................................. 257/712, 713, 257/717, 718, 720, 721, 796; 361/688, 704, 707, 712

[56] References Cited

U.S. PATENT DOCUMENTS 4,811,166 3/1989 Alvarez et al. ........................ 257/720

5,317,194 5/1994 Sako ........................................ 257/796

FOREIGN PATENT DOCUMENTS 5-125407 5/1993 Japan .
5-186804 7/1993 Japan .
5-186802 7/1993 Japan .

*Primary Examiner*—Sara W. Crane
*Assistant Examiner*—Carl Whitehead, Jr.
*Attorney, Agent, or Firm*—Sughrue, Mion, Zinn, Macpeak & Seas

[57] ABSTRACT

In a plastic-packaged semiconductor device molded by a synthetic resin, a heat sink is formed by a sheet which has a thermal expansion coefficient between $9.0 \times 10^{-6}$ /K and $23 \times 10^{-6}$ /K and a thermal conductivity greater than 200 W/m·K, which are selected in relation to those of the synthetic resin. The sheet is manufactured by mixing a first metal of a high melting point with a second metal of a low melting point lower than the first metal and by pressing and sintering the mixture. The first and the second metal may be molybdenum and copper, respectively. Alternatively, the sheet may be a composite sheet composed of a molybdenum mesh interposed between a pair of aluminum layers or a stacked sheet composed of a sintered layer of a mixture of molybdenum and copper and a coated layer of either molybdenum or copper.

38 Claims, 5 Drawing Sheets

PLASTIC-PACKAGED SEMICONDUCTOR DEVICE HAVING A HEAT SINK MATCHED WITH A PLASTIC PACKAGE

BACKGROUND OF THE INVENTION

This invention relates to a plastic-packaged semiconductor device which has a heat sink.

It is a recent trend that a plastic package is very often used for packaging a semiconductor chip by transfer molding a resin, such as epoxy resin, to form a semiconductor device. Such a semiconductor device may be called a plastic-packaged semiconductor device. The plastic-packaged semiconductor device inevitably includes a heat sink so as to irradiate heat which is caused to occur from the semiconductor chip. Otherwise, the semiconductor chip is degraded or deteriorated in a temperature characteristic.

Conventionally, a wide variety of heat sinks have been proposed and practically used in a plastic package for accommodating the semiconductor chip. However, most of proposals have been offered to make each thermal expansion coefficient of the heat sinks close to that of a semiconductor material, such as silicon, gallium arsenide, which forms the semiconductor chip. This might be in fear of breakage in the semiconductor chip due to a difference of the thermal expansion coefficients between the semiconductor chip and the heat sink. Taking the above into consideration, a high refractory metal, such as molybdenum, tungsten, or the like, has been used as a material of the heat sink because the high refractory metal is close to the semiconductor material in thermal expansion coefficient.

Meanwhile, it is to be noted that recent requirements are to make a semiconductor device, a heat sink, and the like, light in weight and to cheaply manufacture such a semiconductor device in a mass production fashion. In order to satisfy such requirements, use of the high refractory metal is unsuitable because the high refractory metal has a high density, which makes the heat sink heavy in weight.

According to the inventors' experimental studies, it has been empirically found out that no breakage takes place in the plastic-packaged semiconductor device even when each of the heat sink and the plastic material has a thermal expansion coefficient greater than that of the semiconductor material to some extent. This shows that the thermal expansion coefficient of the heat sink used for the plastic-packaged semiconductor device may not be always close to that of the semiconductor material of the semiconductor chip. In this event, it is preferable that the thermal expansion coefficient of the heat sink does not exceed the thermal expansion coefficient of the plastic material. From this fact, it is readily understood that the heat sink may be formed by a material which is lower in density than the high refractory metal and which is light in weight.

In addition, various kinds of heat sinks are preferably prepared for a wide variety of the plastic-packaged semiconductor devices. As a result, it is desirable that a material of such a heat sink can be readily shaped into various configurations.

Practically, consideration might be made about forming such a heat sink by copper which has a thermal expansion coefficient of $17 \times 10^{-6}/K$ lower than the thermal expansion coefficient of $18 \times 10^{-6}/K$ in epoxy resin. However, the heat sink of copper is undesirably deformed with an increase of a temperature of the semiconductor chip and weak in mechanical strength.

In general, heat sink materials have been proposed in Japanese Patent Applications Nos. 288,517/1991, 20,725/1992, and 3,056/1992 by the instant inventors and are suitable for ceramic packages which mount or package semiconductor chips.

Specifically, a mixture of copper and molybdenum is sintered and pressed in Japanese Patent Application No. 288,517/1991 to form a heat sink sheet composed of the mixture. However, no consideration is made at all in Japanese Patent Application No. 288,517/1991 about application of the heat sink sheet to a plastic-packaged semiconductor device which has a thermal expansion coefficient greater than that of the ceramic package. Accordingly, it is difficult to know whether or not the mixture mentioned in the above-referenced application is suitable for the plastic-packaged semiconductor device.

Alternatively, a composite material or grain consists of molybdenum particles enveloped by copper films in Japanese Patent Application No. 20,725/1992 while a composite material consists of tungsten particles enveloped by copper films in Japanese Patent Application No. 3,056/1992. Such composite materials may be applied to heat sinks used for the plastic-packaged semiconductor devices. However, it has been found out that the composite materials are not suitable for manufacturing the plastic-packaged semiconductor devices in a mass-production fashion because a total amount of copper can not be kept at a predetermined range.

Anyway, disclosure is made neither about a plastic-packaged semiconductor device nor about a heat sink suitable for the plastic-packaged semiconductor device in the above-mentioned applications. Therefore, it is difficult in the prior patent applications to consider demands for the plastic-packaged semiconductor devices.

SUMMARY OF THE INVENTION

It is an object of this invention to provide a plastic-packaged semiconductor device which is manufacturing through a transfer molding process and which includes a heat sink having a thermal expansion coefficient and a thermal conductivity suitable for the plastic-packaged semiconductor device.

It is another object of this invention to provide a plastic-packaged semiconductor device of the type described, which is capable of readily shaping the heat sink in various kinds of shapes.

It is still another object of this invention to provide a heat sink which is suitable for the plastic-packaged semiconductor device in thermal expansion coefficient and thermal conductivity.

It is yet another object of this invention to provide a heat sink which is capable of readily being shaped in a pertinent form in accordance with diversity of the plastic-packaged semiconductor device and manufactured in a mass-production fashion.

According to an aspect of this invention, a plastic-packaged semiconductor device has a heat sink which comprises a substrate formed by a metal composite material comprising a first metal component of a high refractory metal having a first melting point and a second metal component having a second melting point lower than said first melting point. The substrate has a thermal expansion coefficient between $9.0 \times 10^{-6}/K$ and $23.0 \times 10^{-6}/K$ and a thermal conductivity not lower than 200 W/m·K.

DESCRIPTION OF THE PREFERRED EMBODIMENTS

Figure 1:
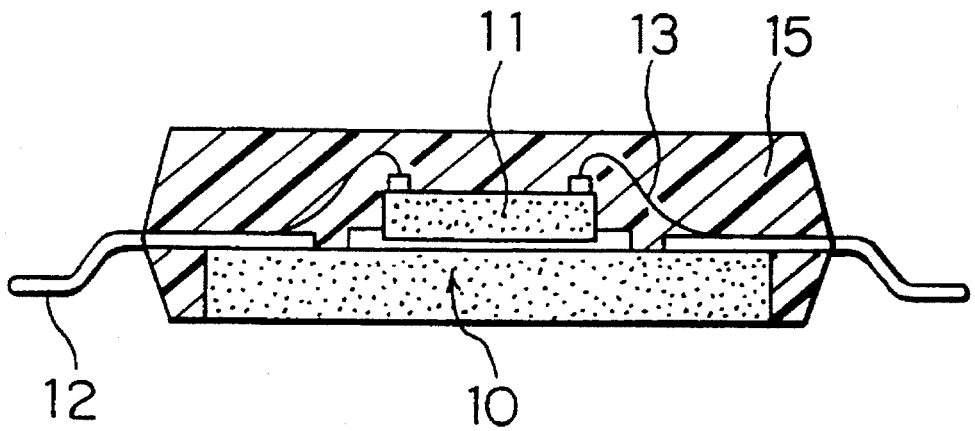
FIG. 1 is a sectional view of a plastic-packaged semiconductor device to which this invention is applicable.
Figure 2:
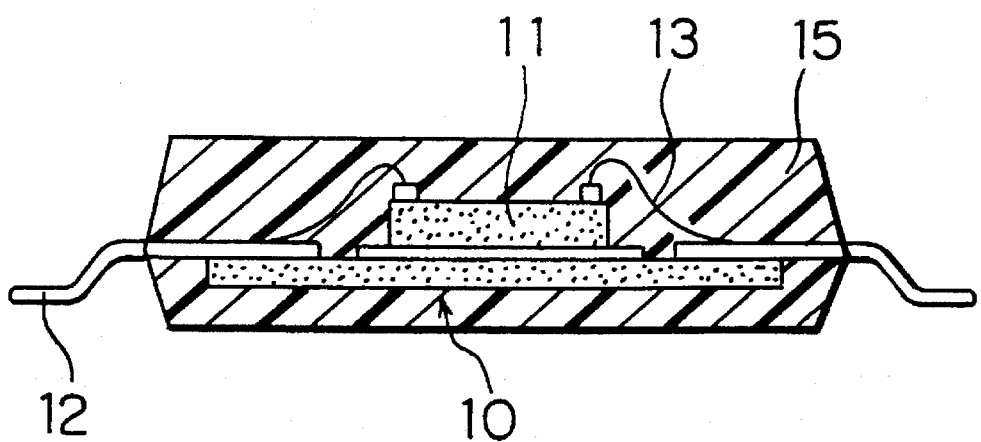
FIG. 2 is a similar sectional view of another plastic-packaged semiconductor device to which this invention is also applicable.

Referring to FIGS. 1 and 2, description will be made about conventional plastic-packaged semiconductor devices each of which is formed by a transfer molding process. In FIG. 1, the illustrated plastic-packaged semiconductor device comprises a heat sink 10 which has a principal or front surface directed upwards of FIG. 1 and a back surface opposite to the principal surface and which will be described later in detail, a semiconductor chip 11 bonded on the principal surface by solder, a plurality of pins 12 mounted on the principal surface of the heat sink 10 and extended outside of the heat sink 10. A plurality of conductors 13 are connected between the pins 12 and electrodes located on the semiconductor chip 11.

As shown in FIG. 1, the heat sink 10, the semiconductor chip 11, the pins 12, and the conductors 13 are transfer molded by a synthetic resin 15 which may be, for example, an epoxy resin, a phenol resin, or the like. In the illustrated example, the back surface of the heat sink 10 is exposed to an external atmosphere.

At any rate, the synthetic resin 15 may have a thermal expansion coefficient between $18 \times 10^{-6}$/K and $23 \times 10^{-6}$/K. On the other hand, the semiconductor chip 11 may be formed, for example, by silicon or gallium arsenide which may have a thermal expansion coefficient between $4 \times 10^{-6}$/K and $6.5 \times 10^{-6}$/K and a thermal conductivity between 50 W/m·K and 100 W/m·K.

In FIG. 2, the plastic-packaged semiconductor device is similar in structure to that illustrated in FIG. 1 except that the heat sink 10 is completely molded by the synthetic resin 15 without exposure of the back surface of the heat sink 10 and is thinner than that of FIG. 1. The heat sinks 10 of FIGS. 1 and 2 has a rectangular shape.

In any event, this invention is applicable to both the plastic-packaged semiconductor devices shown in FIGS. 1 and 2, as will become clear later.

Figure 3:
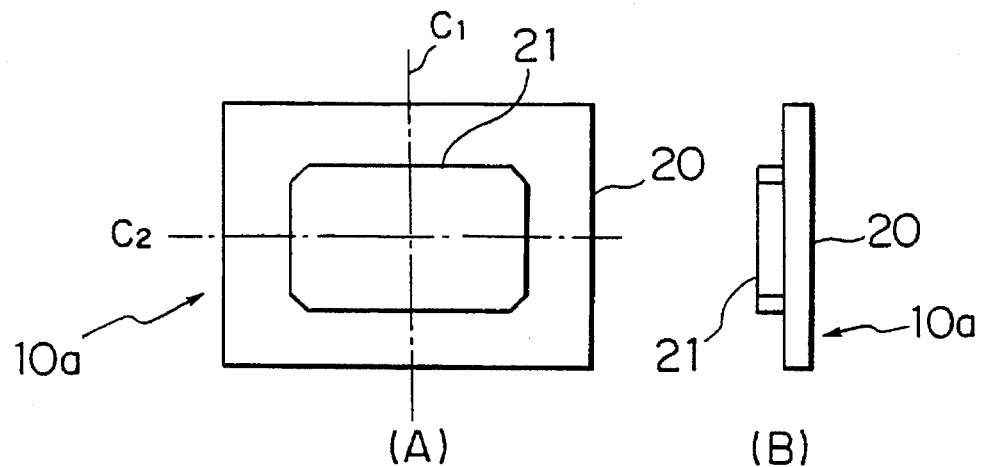
FIG. 3 is a plan view of a heat sink which is used in the plastic-packaged semiconductor devices illustrated in FIGS. 1 and 2.
Figure 4:
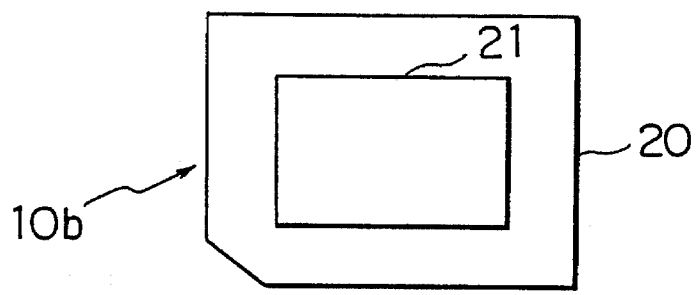
FIG. 4 is a plan view of another heat sink that is also used in the plastic-packaged semiconductor devices.
Figure 5:
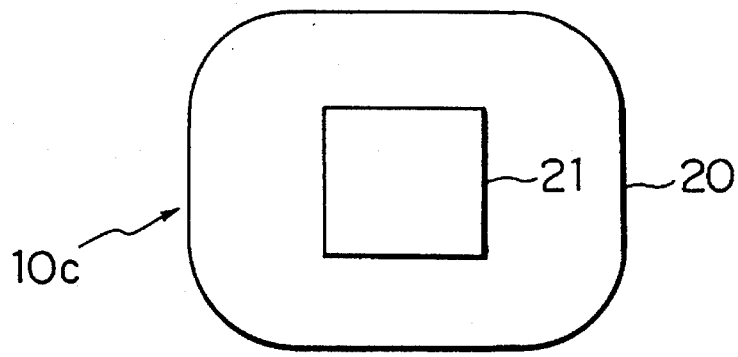
FIG. 5 is a plan view of another heat sink used in the plastic-packaged semiconductor devices.

Referring to FIGS. 3 through 5, exemplification is made about heat sinks 10a, 10b, and 10c which have configurations different from one another and from the heat sinks illustrated in FIGS. 1 and 2. In FIGS. 3 to 5, each of the illustrated heat sinks 10a to 10c has a base plate 20 and a support plate 21 mounted on the base plate 20 stepwise. Thus, the support plate 21 is offset from the base plate 20 and may be referred to as an offset plate which supports a semiconductor chip as illustrated in FIGS. 1 and 2.

More specifically, the support plate 21 illustrated in FIG. 3(A) and (B) has also a rectangular shape chamfered at four corners of the support plate 21 and is located at a position symmetrical with vertical and horizontal center lines C1 and C2 of the base plate 20.

In FIG. 4, the heat sink 10b has the base plate 20 cut at a single corner of the base plate 20 and the support plate 21 of a rectangular shape integrated with the base plate 20 in a manner to be described later. The support plate 21 is positioned like in FIG. 3.

As shown in FIG. 5, the base plate 20 of the heat sink 10c is chamfered and rounded at four corners thereof and is integrated with the support plate 21 of a square shape. The support plate 21 is mounted on a center portion of the base plate 20 like in FIGS. 3 and 4.

Figure 6:
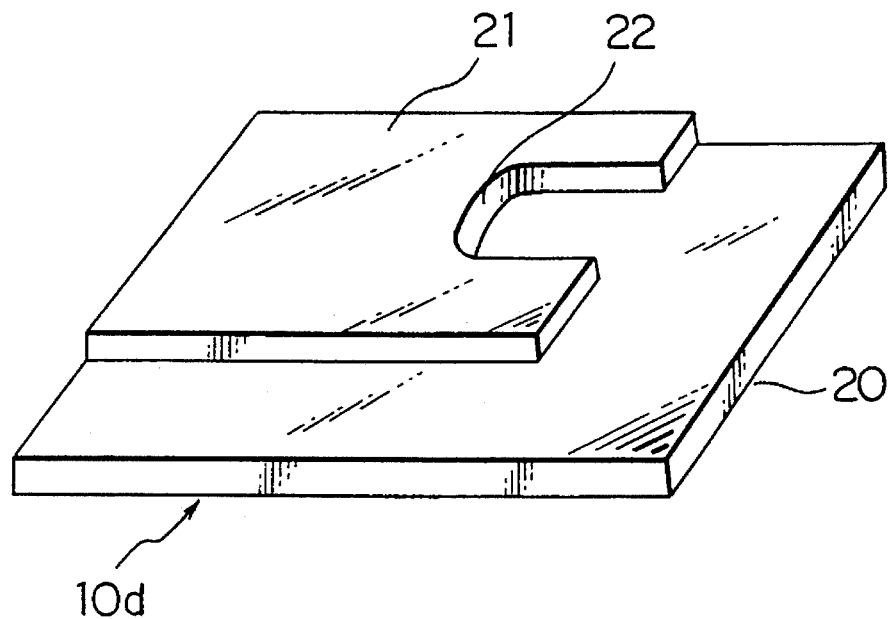
FIG. 6 is a perspective view of a further heat sink used in the plastic-packaged semiconductor devices.

Referring to FIG. 6, another heat sink 10d comprises the rectangular base plate 20 and the support plate 21 mounted on the base plate 20. The illustrated support plate 21 is located on the base plate 20 at a position which is asymmetrical with vertical and horizontal center lines as depicted at C1 and C2 in FIG. 3(A). In addition, the support plate 21 has a U-shaped portion 22 opened rightwards of FIG. 6.

Thus, a wide variety of the heat sinks 10 (suffixes omitted) are used in the plastic-packaged semiconductor devices as shown in FIGS. 1 and 2.

Figure 7:
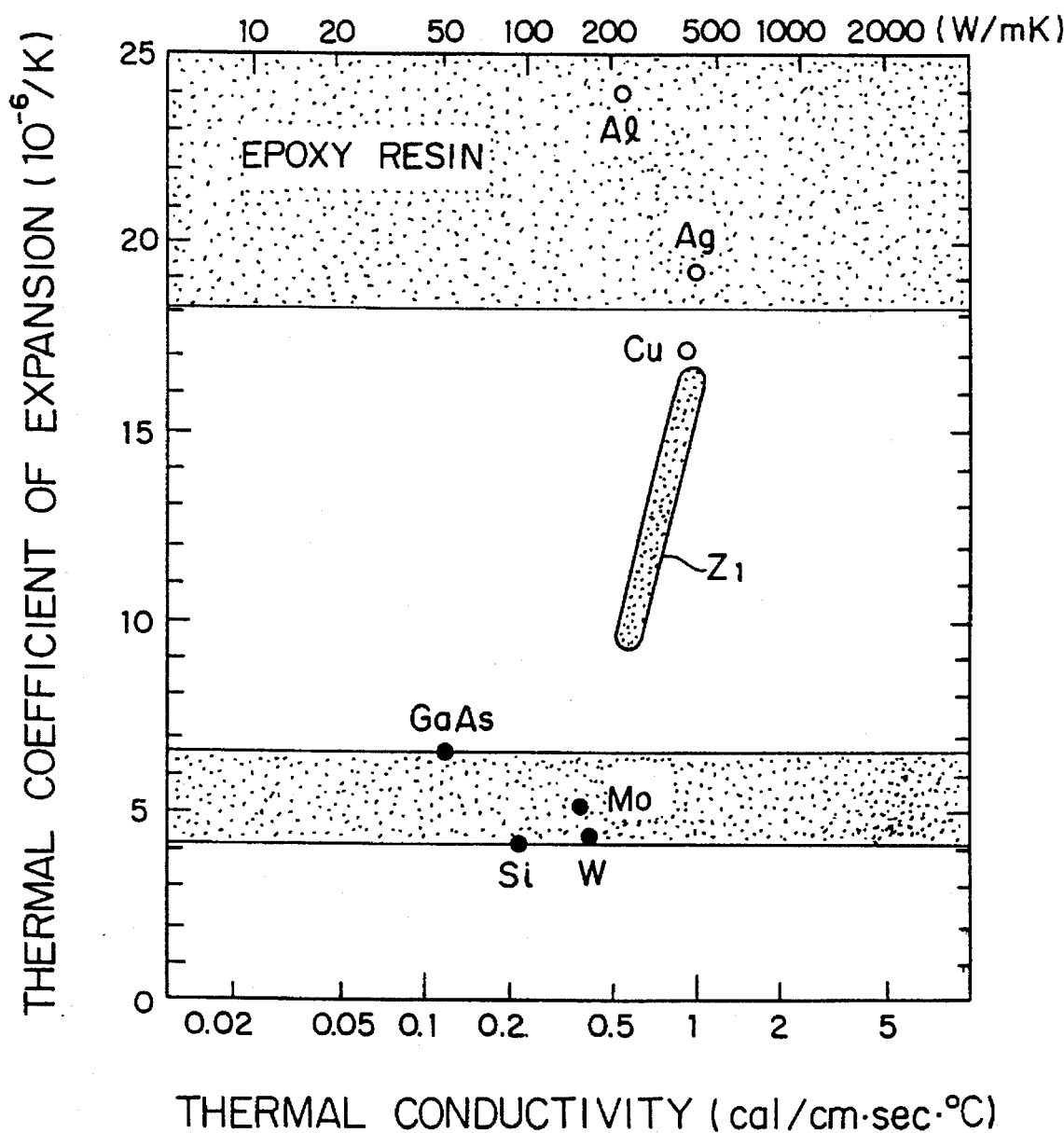
FIG. 7 is a graphical representation of a characteristic required for a heat sink of the plastic-packaged semiconductor devices.

Referring to FIG. 7, it has been found out by the instant inventors that a material of each heat sink, such as 10a to 10d, may preferably have a thermal expansion coefficient between $9.0 \times 10^{-6}$/K and $17 \times 10^{-6}$/K and a thermal conductivity which is not smaller than 200 W/m·K, as depicted at a zone Z1 in FIG. 7, when the epoxy resin which has a thermal expansion coefficient of $18 \times 10^{-6}$/K is used in the plastic-packaged semiconductor device. As illustrated in FIG. 7, the zone Z1 has a lowest thermal expansion coefficient higher than that of molybdenum and a highest thermal expansion coefficient lower than that of copper.

Alternatively, it has been confirmed that the material of the heat sink may be mainly selected in consideration of the thermal expansion coefficient of the synthetic resin. This shows that the thermal expansion coefficient of the heat sink may become higher than $18 \times 10^{-6}$/K when the synthetic resin has a thermal expansion coefficient greater than $18 \times 10^{-6}$/K.

Figure 9:
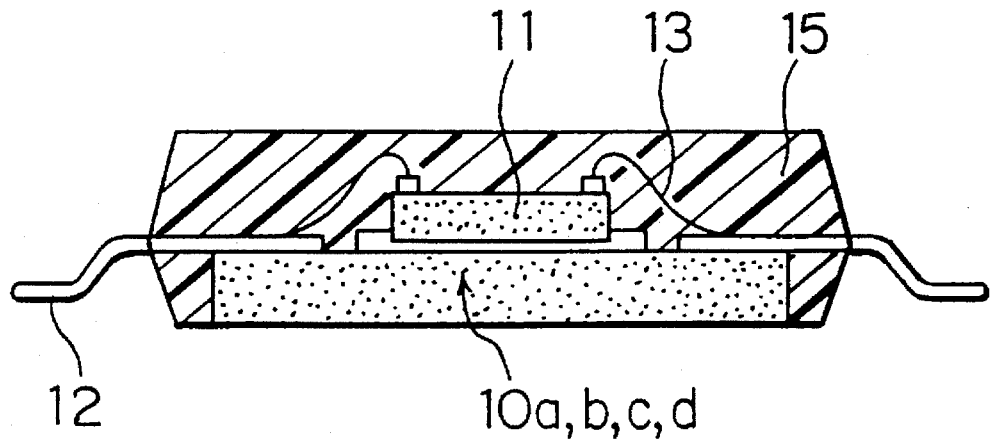
FIG. 9 is a sectional view of a plastic-packaged semiconductor device according to the presently claimed invention.
Figure 10:
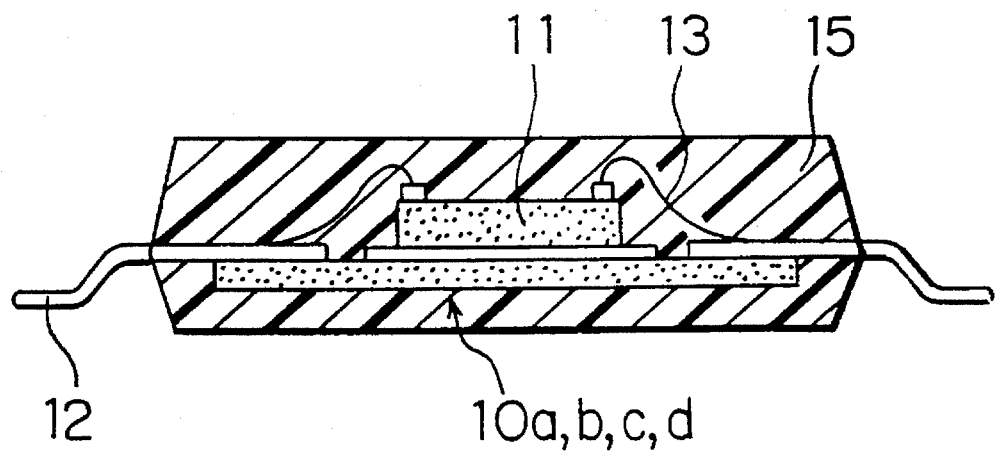
FIG. 10 is a similar sectional view of another plastic-packaged semiconductor device according to the presently claimed invention.

Now, description will be mainly made as regards heat sinks according to this invention, as shown in FIGS. 9 and 10, which satisfy the above-mentioned conditions and which are applicable to the plastic-packaged semiconductor devices.

First Embodiment

As a material of a heat sink, namely, a heat sink material, a mixture is selected which comprises, by weight, 35–97% of copper and molybdenum as the balance. Such a mixture is obtained by mixing copper powder with molybdenum powder by a mixing method. Herein, it is well known that molybdenum is a high refractory metal having a high melting point and may be called a first metal while copper has a melting point lower than molybdenum and a thermal conductivity higher than molybdenum, as illustrated in FIG. 7 and may be called a second metal. The mixture is subjected to press forming into a green or pressed compact block.

Subsequently, the pressed compact block is sintered into a sintered block in an atmosphere of a reduction gas or an inactive gas at a temperature between 1000° C. and 1400° C. The sintered block is heated and kept at a temperature between 800° C. and 1000° C. for several minutes and subjected to hot rolling at the temperature into a hot-rolled block. When the hot rolling is carried out at a temperature lower than 800° C., cracks are liable to occur in the sintered block to be hot-rolled because deformation is too small in such a sintered block. On the other hand, when the hot rolling is carried out at a temperature higher than 1000° C., a copper component of the sintered block is softened or partially melted due to a variation of the temperature in the hot rolling.

The hot-rolled block is kept for several minutes at the same temperature and is repeatedly subjected to a similar hot rolling process to obtain a finally hot-rolled block which has a thickness thicker than a desired thickness by a preselected thickness in consideration of a later process as will be presently described. The finally hot-rolled block is cold rolled into a finished block which has the desired thickness and no cracks. The finished block is mechanically processed into the heat sink for the plastic-packaged semiconductor device as mentioned before.

In connection with the first embodiment, first through seventh samples according to the first embodiment are enumerated in Table 1.

the first embodiment can be widely controlled to be favorably matched with the plastic-packaged semiconductor device by changing the amount of copper relative to the amount of molybdenum.

Herein, the sixth sample among the first through the sixth samples is selected to describe a method of manufacturing the heat sink and the plastic package. At first, mixture powder which comprises, by weight, 97% of copper and the balance formed by molybdenum is prepared by a mixing method and pressed at a pressure of 3 tons/cm$^2$, namely, 294 MPa into a pressed block. Thereafter, the pressed block is sintered into a sintered block under a reduction atmosphere. The sintered block has a thickness of 25 mm and a relative density of 99% relative to a theoretical density of the sintered block. Description will be made as regards the relative density.

The sintered block is heated to a temperature of 900° C. and kept at the temperature for fifteen minutes and is hot rolled at a reduction rate of 20% one time and repeatedly hot rolled at the same temperature and the same reduction rate to obtain a hot-rolled plate of 2.5 mm thick. Finally, the rolled plate is cold rolled into a cold-rolled plate which has a desired thickness of 1 mm.

The cold-rolled plate has a density of 9.0 (g/cm$^3$), a thermal expansion coefficient of $17.0 \times 10^{-6}$/K, a thermal conductivity of 384 (W/m·K), and a surface roughness Ra of 0.1 micronmeter. It has been found out that the cold-rolled plate is suitable for the heat sink for the plastic package.

In order to manufacture the heat sink which has a step portion as illustrated in FIGS. 3 through 6, the hot-rolled

TABLE 1

|  | Pure Mo | 37.7% Cu | 40% Cu | 60% Cu | 70% Cu | 85% Cu | 97% Cu | Pure Cu |
|---|---|---|---|---|---|---|---|---|
| Thermal Expansion Coefficient ($\times 10^{-6}$/K) | 5.1 | 9.1 | 9.5 | 12.3 | 13.7 | 14.7 | 17.0 | 17.3 |
| Thermal Conductivity (W/m · K) | 142 | 210 | 222 | 289 | 306 | 326 | 384 | 394 |

The first through the fifth samples include, by weight, 37.7%, 40%, 60%, 70%, 85%, and 97% of copper (Cu) and the balance formed by molybdenum (Mo), respectively. In Table 1, first and second comparative samples are also exemplified which are composed of pure molybdenum and pure copper, respectively. As shown in Table 1, the first comparative sample (pure Mo) has a thermal expansion coefficient of $5.1 \times 10^{-6}$/K and a thermal conductivity of 142 (W/m·K) while the second comparative sample (pure Cu) has a thermal expansion coefficient of $17.3 \times 10^{-6}$/K and a thermal conductivity of 394 (W/m·K).

Each of the first through the sixth samples has the thermal expansion coefficients distributed between 9.0 and $17.3 \times 10^{-6}$/K and the thermal conductivities distributed between 142 and 394 (W/m·K). Each of the thermal expansion coefficients and the thermal conductivities in the first through the sixth samples becomes large with an increase of an amount of copper and falls within the zone Z1 illustrated in FIG. 7.

Therefore, the first through the sixth samples are effectively used as the heat sink for the plastic-packaged semiconductor device which is transfer molded by the epoxy resin and which is shown in FIG. 9 or 10. From this fact, it is readily understood that the thermal expansion coefficients and the thermal conductivities of the heat sinks according to plate may be processed or subjected to a sizing process by a stepped die at a temperature of 100° C. Thus, it has been confirmed that each of the first through the sixth samples has an excellent workability.

Second Embodiment

As a heat sink material, a mixture is prepared which comprises, by weight, 10–40% of copper and the balance formed by molybdenum. Subsequently, 0.05–0.5% of carbon is added by weight to the mixture by using Mo$_2$C as a carbon source to form composite powder of copper, molybdenum, and carbon. The composite powder is pressed and sintered to form a sintered block which includes a suitable amount of carbon as a remnant component and which has a relative density equal to or greater than 85%.

It has been confirmed that the sintered block has an excellent toughness because grain boundaries among copper particles and molybdenum particles are reinforced by addition of the carbon.

More specifically, various sintered blocks are prepared as seventh through ninth samples in connection with the second embodiment according to this invention as enumerated in Table 2. Tenth and eleventh samples are also prepared as comparative samples.

TABLE 2

| SAMPLE No. | AMOUNT OF C | RELATIVE DENSITY (%) | REMAINING AMOUNT OF C (ppm) | TRANSVERSE RUPTURE STRENGTH (MPa) | FLEXI-BILITY ABILITY (mm) |
| --- | --- | --- | --- | --- | --- |
| 7  | 0.05% | 91.47 | 110  | 1040 | 0.62 |
| 8  | 0.20% | 90.63 | 780  | 1290 | 0.88 |
| 9  | 0.50% | 89.76 | 2100 | 1600 | 1.37 |
| 10 | 0.80% | 88.52 | 4950 | 1240 | 0.53 |
| 11 | 1.00% | 87.48 | 6080 | 1150 | 0.34 |

As shown in Table 2, an amount of carbon, a relative density, a remaining amount of carbon, transverse rupture strength, and a flexibility amount are tabulated in connection with the seventh through the eleventh samples according to the second embodiment.

In order to explain the second embodiment more in detail, description will be made about a method of manufacturing the seventh sample. At first, a mixture is prepared in the form of mixed powder which comprises, by weight, 20% of copper and 80% of molybdenum. Thereafter, 0.05% of carbon is added by weight to the mixed powder by using $Mo_2C$ as a carbon source. Such mixed powder which includes carbon may be called composite powder.

The composite powder is pressed under a pressure of 294 MPa into a pressed block. The pressed block is sintered at a temperature of 1150° C. for two hours in a hydrogen atmosphere to form a sintered block. The sintered block is ground on the basis of a known standard to form a sintered plate which has a thickness of 3.20 millimeters and a length of 7.20 millimeters. The resultant sintered plate includes 110 ppm of carbon, as shown in Table 2.

A transverse test is carried out about the sintered plate to measure the transverse rupture strength and the flexibility ability in a known manner. As a result, the sintered plate has the transverse rupture strength and the flexibility ability improved in comparison with a sintered plate which includes no carbon.

In the meanwhile, the relative density (%) which may be depicted at Dr is given by:

$$Dr = (Dm/Di) \times 100,$$

where Dm is representative of a measured value $(g \cdot cm^{-3})$ and Di, a theoretical value $(g \cdot cm^{-3})$ and where in turn Di is also given by:

$$Di = 100/[((Cu\ \%\ by\ weight)/(density\ of\ Cu(g \cdot cm^{-3}))) + ((Mo\ \%\ by\ weight)/(density\ of\ Mo(g \cdot cm^{-3})))].$$

Herein, consideration is made about a relationship between workability and the relative density. As shown in Table 2, if each sintered block has the relative density Dr which is not smaller than 85%, as enumerated in Table 2, it has been found out that such a sintered block is excellent in workability. In this connection, each of the samples shown in Table 2 can be readily shaped or processed into a stepped configuration as illustrated in FIGS. 2 through 6.

Likewise, twelfth and the thirteenth samples are manufactured by changing an amount of copper relative to an amount of molybdenum. Specifically, the twelfth and the thirteenth samples are obtained by preparing mixtures which comprise, by weight, 10% and 40% of copper and the balance formed by molybdenum, respectively, by adding 0.5% by weight of carbon to the mixtures, and by pressing and sintering the mixtures of Cu, Mo, and C into sintered plates. The twelfth and the thirteenth samples formed by the sintered plates exhibit the transverse rupture strength and the flexibility ability, as shown in Table 3.

TABLE 3

| SAMPLE No. | AMOUNT OF C | RELATIVE DENSITY (%) | REMAINING AMOUNT OF C (ppm) | TRANSVERSE RUPTURE STRENGTH (MPa) | FLEXI-BILITY ABILITY (mm) |
| --- | --- | --- | --- | --- | --- |
| 12 | 10% | 87.43 | 1950 | 1400 | 0.98 |
| 14 | 40% | 94.27 | 2700 | 1970 | 2.41 |

No improvement of the transverse rupture strength and flexibility ability is found out when the amount of carbon is less than 0.05%.

On the other hand, it is to be noted that workability of such a sintered plate is degraded with a reduction of the relative density and that the flexibility ability is reduced with an increase of an amount of carbon. According to the inventors' experimental studies, it has been confirmed that the workability can not be substantially degraded, if the relative density is greater than 89% and that the flexibility ability is preferably greater than 0.6 mm. This means that the amount of carbon preferably exceeds 0.5% by weight. In this connection, the tenth and the eleventh samples may be excluded from the second embodiment of this invention.

As readily understood from Table 3, the transverse rupture strength and the flexibility ability are improved with an increase of the amount of copper. At any rate, the seventh through the thirteenth samples have the excellent toughness specified by the transverse rupture strength and the flexibility ability.

In addition, it is found out that the addition of carbon to the mixed powder of copper and molybdenum brings about no substantial change of the thermal expansion coefficient and the thermal conductivity. This means that the seventh through the thirteenth samples can be used for the plastic-packaged semiconductor devices like in the first embodiment when the amount of copper is increased relative to molybdenum. In other words, more than 40% of copper may be mixed by weight with the molybdenum and carbon like in the first embodiment when the second embodiment is applied to the plastic-packaged semiconductor device. Moreover, it is possible with the second embodiment to manufacture stepped heat sinks as shown in FIGS. 3 through 6, by carrying out the sizing process in the manner mentioned in conjunction with the first embodiment.

Practically, an amount of carbon can be reduced with an increase of copper. Such a reduction of an amount of carbon exhibits convenient characteristics for the heat sink of the plastic-packaged semiconductor device, although the flexibility ability is somewhat reduced.

In order to manufacture another sample suitable for the heat sink of the plastic-packaged semiconductor device, more than 40% of copper is added to molybdenum together with carbon which is reduced to less than 0.05%. Specifically, 0.02% of carbon is added by using $Mo_2C$ as a carbon source to a mixture which comprises, by weight, 60% of copper and 40% of molybdenum, to form composite powder. The composite powder is pressed under a pressure of 294 MPa and is sintered for two hours at a temperature of 1250° C. into a sintered block.

In the example, a stepped die which corresponds to the heat sink as illustrated in FIG. 5 is used to press the composite powder. As a result, the sintered block has a configuration, as shown in FIG. 5, and the relative density of 90%. The remnant amount of carbon is equal to 100 ppm in the sintered block. On pressing the composite powder, neither cracks nor projections are found out at corners of the sintered block. In addition, the sintered block has a thermal expansion coefficient of $12.1 \times 10^{-6}$/K and a thermal conductivity of 0.62 cal/cm·sec·K, namely, 261 W/m·K.

A further sample is prepared by mixing, by weight, 80% of copper and 20% of molybdenum, by adding, by weight, 0.02% of carbon to the mixture by using $Mo_2C$ as a carbon source, by pressing the mixture including carbon as an additive, under a pressure of 294 MPa, and by sintering a pressed block into a sintered block at a temperature of 1250° C. for two hours. The sintered block comprises, by weight, 100 ppm and has a thermal expansion coefficient of $14.7 \times 10^{-6}$/K, a thermal coefficient of 310 W/m·K, and a relative density of 95%.

On pressing the above-mentioned mixture, the stepped die may be used in a manner similar to the above-mentioned sample to form a stepped sintered block or a stepped heat sink as illustrated in FIGS. 3 through 6. In this event, neither cracks nor projections are caused to occur at the four corners of the sintered block.

Third Embodiment

A heat sink according to a third embodiment has a light weight in comparison with the heat sinks according to the first and the second embodiments and a thermal expansion coefficient and a thermal conductivity both of which are variable over a wide range to be matched with various kinds of plastic materials used in the plastic-packaged semiconductor devices. Specifically, the heat sink according to the third embodiment of this invention has the density lower than that of the copper (8.93 g·cm$^{-3}$) and the thermal expansion coefficient greater than that of molybdenum ($5.3 \times 10^{-6}$/K).

For this purpose, a molybdenum mesh is at first formed as a base member and is interposed between a pair of aluminum sheets covered on the molybdenum mesh to structure a composite sheet. Each of the aluminum sheets may be called a bonding sheet. Thus, the composite sheet is specified by a triplet structure of Al/Mo/Al. The composite sheet may be manufactured by interposing the base member between the bonding sheets and by rolling the base member and the bonding sheets to integrate them one another. Preferably, each of the bonding sheets may have a surface layer plated or cladded on a surface of each bonding sheet. The surface layer serves to improve a bonding characteristic between the base member and each of the bonding sheets.

With this structure, the composite sheet has the density between 2 and 5 g·cm$^{-3}$ and the thermal expansion coefficient between $10 \times 10^{-6}$/K and $23 \times 10^{-6}$/K.

Specifically, a fourteenth sample is manufactured in the above-mentioned manner. At first, provision is made of a molybdenum mesh which has a nominal size of 710 micronmeters and which is formed by each molybdenum string having a diameter of, for example, 0.450 millimeter. In this event, each molybdenum string is previously processed so as to remove graphite from a string surface and is subjected to a wet process to deposit a nickel-plated layer on the molybdenum string. The nickel-plated layer is 0.5 micronmeter thick.

Thereafter, the molybdenum mesh which is nickel plated in interposed between a pair of aluminum plates each of which has a thickness of 10 millimeters. Thus, a composite block which is composed of the molybdenum mesh and the aluminum sheets is formed to be rolled at a temperature of 300° C. to a thickness of 10 millimeters and is rendered into a composite-rolled sheets. The composite-rolled sheet is subjected to cold rolling to keep flatness. Thus, the composite sheet of three layers is obtained which comprises the molybdenum mesh as the base member and aluminum layers as the bonding sheets.

Herein, it is to be noted that each of the aluminum sheets may be preferably subjected to nickel plating by the use of a zinc immersion process before the molybdenum mesh is interposed by the aluminum sheets. In this case, each surface of the aluminum sheets is degreased and is immersed for thirty seconds in an alkali substitutional solution which is kept at a temperature of 40° C. and which is sold in the name of Al-20 by World Metal Company Ltd. Subsequently, etching is carried out within an acid solution of $HNO_3$ or the like so as to remove smuts from each surface of the aluminum sheets. The aluminum sheets are thereafter subjected to surface treatment by the use of zinc substitutional solution which essentially includes NaOH and $ZnCl_2$. Finally, nickel plating is carried out in a watt bath with a current of 1 A/dm$^2$ caused to flow through the bath.

After the nickel plating is finished, the aluminum sheets are cleaned and baked in a hydrogen atmosphere for twenty minutes at a temperature of 410° C. Thus, each of the aluminum sheets is coated by a plated film of 1 micronmeter. When such aluminum sheets are used to form the composite sheet in the above-mentioned manner, the composite sheet has a density of 2.9 g·cm$^{-3}$, a thermal expansion coefficient of $11.9 \times 10^{-6}$/K, and a thermal conductivity of 0.5 cal/cm·sec, namely, 210 W/m·K.

Figure 8:
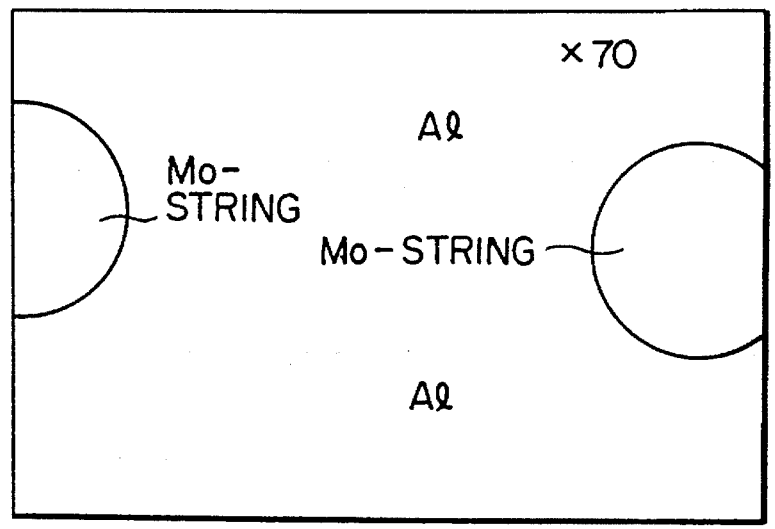
FIG. 8 is a sectional view of a part of a heat sink according to an embodiment of this invention.

The composite sheet mentioned above has the molybdenum strings and the aluminum sheets combined together, as shown in FIG. 8. In any event, the composite sheet is effective to form the heat sink for the plastic-packaged semiconductor device because the thermal expansion coefficient can be changed over a wide range.

Fourth Embodiment

A heat sink according to a fourth embodiment of this invention can be also obtained by covering or wrapping a sintered block which is composed of a mixture comprising a first metal of a high melting point and a second metal of a low melting point lower than the first metal. The first metal may be, for example, molybdenum or tungsten while the second metal may be, for example, copper. During the wrapping process, the sintered block is covered with a metal sheet of a metal, such as copper, included in the sintered block. Specifically, the sintered block is wrapped into a wrapped block on a block surface that is subjected to a deformation process, such as a hot rolling process, a cold rolling process and that may be both front and back surfaces of the sintered block or a whole surface of the sintered block including the front and the back surfaces and side surfaces. The metal sheet may have a thickness falling within a range between 0.01 and 2 times the thickness of the sintered block.

Subsequently, the wrapped block is rolled into a stacked sheet of a sintered rolled layer and a rolled metal layer covered on the sintered rolled layer. It has been confirmed that the stacked sheet is suitable for the heat sink of the plastic-packaged semiconductor device.

With this structure, it is possible to change a composition of the sintered block over a wide range. In addition, the stacked sheet can be processed to form a stepped portion as illustrated in FIGS. 3 through 6 when the metal sheet is formed by a metal, such as copper, having ductility and covers the whole surface of the sintered block. In this case, a side surface of the offset or the step portion can also be covered with the rolled metal layer even after the stepping or sizing process of the wrapped block is finished.

If the rolled metal layer is unnecessary for the heat sink, the rolled metal layer may be removed from the sintered rolled layer by a known process, for example, a lapping process.

Description will be directed to fifteenth through eighteenth samples according to the fourth embodiment so as to facilitate an understanding of this invention.

Fifteenth Sample

Provision is made of a mixture which is composed of mixed powder of copper and molybdenum and which comprises, by weight, 39% of copper and 61% of molybdenum. The mixture is pressed under a pressure of 3 tons/cm² into a pressed block. The pressed block is sintered in a reduction atmosphere into a sintered block which has a thickness of 8 millimeters and a relative density between 90 and 98%.

Subsequently, the sintered block is wrapped by an oxygen free copper sheet of 2 millimeters thick into a wrapped block. The wrapped block is heated to a temperature of 900° C. and kept at the temperature for fifteen minutes in a hydrogen atmosphere and thereafter hot rolled at a reduction rate of 20% one time. Next, the same hot-rolling process is carried out at the same temperature in the same atmosphere at the same reduction rate to obtain a hot-rolled sheet which has a thickness of 3 millimeters. Thus, the hot-rolling processes are repeated twice in the fifteenth sample.

The hot-rolled sheet has a thickness thicker than a desired thickness of 1 millimeter by 2 millimeters and is cold rolled to form the stacked sheet of the desired thickness. The stacked sheet has a copper layer of 100 micronmeters thick and comprises, by weight, 40% of copper. In addition, the stacked sheet has a roughness or flatness specified by Ra= 0.1 micronmeter and is excellent in flatness.

Sixteenth Sample

A mixture is prepared which comprises, by weight, 68% of copper and 32% of molybdenum in the form of mixed powder. The mixture is pressed and sintered to form a sintered block in the manner mentioned in conjunction with the fourteenth sample. The resultant sintered block has a thickness of 12 millimeters and a relative density between 90 and 98%.

The sintered block is wrapped into a wrapped block by an oxygen free copper sheet of 2 millimeters thick. The wrapped block is hot rolled and cold rolled like in the fifteenth sample to form a stacked sheet which has a thickness of 1 millimeter. The stacked sheet thus obtained comprises a copper layer of 150 micronmeters thick and, by weight, 70% of copper in total. The flatness of the stacked sheet is substantially identical with that of the fourteenth sample.

Seventeenth Sample

A sintered block is formed by mixing, by weight, 41% of copper and 59% of molybdenum, by pressing the mixture into a pressed block in the same pressure as the fifteenth example, and by sintering the pressed block. The sintered block has a thickness of 8 millimeters and the relative density between 90% and 98%. The sintered block is wrapped into a wrapped block by the use of a molybdenum having a thickness of 0.3 millimeter.

The wrapped block is pressed and rolled in the same conditions as the previous samples to be formed into a stacked sheet of 1 millimeter thick. The stacked sheet has a molybdenum layer of 50 micronmeters thick and comprises, by weight, 40% of copper. The flatness of the stacked sheet is substantially equal to that of the other sheets.

Eighteenth Sample

A sintered block is obtained by uniformly mixing, by weight, 84% of copper and 16% of tungsten and by pressing and sintering the mixture under the same condition as the other samples. The sintered block has a thickness of 4 millimeters and a relative density between 90 and 98%. In this sample, the sintered block is wrapped into a wrapped block by the use of a copper sheet of 0.3 millimeter thick. The wrapped block is subjected to pressing and rolling processes on the same conditions as the other samples into a stacked sheet which has a thickness of 1 millimeter. The stacked sheet comprises, by weight, 85% of copper and has a copper layer of 50 micronmeters thick and the flatness equivalent to the other samples mentioned above.

According to the inventors' experimental studies, it has been found out that the wrapped block may be heated to a temperature between 800° C. and 1000° C. If the temperature is lower than 800° C., cracks are liable to occur in the hot-rolled block during the hot-rolling processes due to a lack of a deformation ability in the wrapped block. On the other hand, if the temperature is higher than 1000° C., the copper included in the wrapped block is seriously softened or melted due to a variation of the temperature. In addition, the hot-rolled sheet may be subjected to annealing and lapping processes before the cold-rolling process.

Moreover, the stacked sheet may be covered with the metal sheet which has a thickness between 50 and 300 micronmeters. Anyway, the stacked sheets according to the fifteenth through the eighteenth samples have a thermal expansion coefficient between $5 \times 10^{-6}$/K and $15 \times 10^{-6}$/K and a thermal conductivity between 150 and 300 (W/m·K). Preferably, the thermal expansion coefficient and the thermal conductivity are not smaller than $9.0 \times 10^{-6}$/K and 200 (W/m·K), respectively, when the stacked sheet is applied to the plastic-packaged semiconductor device. Accordingly, the stacked sheets mentioned above are applicable to the heat sink of the plastic-packaged semiconductor device.

In order to manufacture the heat sink, the stacked sheet is stamped or punched by the use of a die floating method into a plurality of plates or pieces each of which has a size of 25 millimeters×25 millimeters and which is subjected to nickel plating. On punching the stacked sheet, no crack takes place at a peripheral portion of each plate. The nickel-plated layer is uniform on each of the plates. Each plate serves not only as the heat sink for the plastic package but also as a heat sink for a ceramic package by controlling the amount of copper. This is because neither crack nor warp is caused to occur on the above-mentioned plate even when each plate is heated to a comparatively high temperature so as to bond a semiconductor chip onto the plate by a solder.

From this fact, it is readily understood that the stacked sheet according to the fourth embodiment is excellent in workability because no crack takes place during the deformation process or the stamping process. This means that the stacked sheets can be processed or formed into a wide variety of configurations because of the excellent workability. Furthermore, inasmuch as the sintered block is wrapped by a flat metal sheet during the rolling process, projections of oxide materials are not adhered to a work roll during the rolling process.

Fifth Embodiment

The fifth embodiment according to this invention comprises an aluminum layer and a pair of molybdenum layers interposing the aluminum layer and is therefore specified by a triplet structure. Hereinunder, description will be made about nineteenth through twenty-first samples according to the fifth embodiment.

Nineteenth Sample

At first, provision is made of a substrate which comprises a plate of aluminum having a diameter of 200 millimeters and a thickness of 0.75 millimeter and which has front and back surfaces opposite to each other and a side surface between the front and the back surfaces. On the front and the back surfaces, a nickel layer is deposited by nickel plating by the use of a zinc substitutional method to a thickness of 3 micrometers. The substrate is interposed between two bonding plates of molybdenum each of which has the same diameter as the substrate and a thickness of 0.15 micronmeter. Thus, a triplet of Mo/Al/Mo can be formed as a stacked block.

Subsequently, the stacked block is hot pressed to be bonded together within a vacuum atmosphere under a pressure of 280 kgf/cm². Under the circumstances, the stacked block is kept at a temperature of 500° C. for two hours to form a stacked sheet which comprises three layers composed of two molybdenum layers and a single aluminum layer. The stacked sheet has a thickness of 1.05 millimeter and is polished by the use of abrasive grains into a thickness of 1 millimeter. The stacked sheet thus obtained has a thermal expansion coefficient of 12.4×10⁻⁶/K, a thermal conductivity of 200 W/m·K, a density of 4.8 g/cm³, and a bonding strength of 2.0 kgf/mm². In addition, the three layers of the stacked sheet are stacked in parallel to one another.

The stacked sheet is punched by a die floating method to form a plurality of stacked pieces or plates. Each of the stacked pieces is coated by a nickel layer by plating to form a heat sink which is composed of the aluminum layer interposed between two molybdenum layers.

Twentieth Sample

An aluminum substrate of 2.65 millimeters thick is interposed between two molybdenum sheets are interposed between two bonding plates of molybdenum to form a stacked block of 3.01 millimeters thick in a manner similar to that mentioned in conjunction with the eighteenth sample. The stacked block is cold rolled to provide a stacked sheet which has a thickness of 3.0 millimeters, a thermal expansion coefficient of 17.4× 10⁻⁶/K, a thermal conductivity of 215 W/m·K, and a bonding strength of 4.9 kgf/mm². It is to be noted that the stacked sheet has a density of 3.6 g/cm³ and is very light in weight and that a single aluminum layer and two molybdenum layers are stacked in parallel to one another.

Twenty-first Sample

An aluminum substrate of 1.0 millimeter thick is interposed between two molybdenum sheets of 15 micronmeters thick to be bonded together by hot pressing. Such hot pressing is carried out under a pressure of 200 kgf/cm² at a temperature of 550° C. for two hours to provide a stacked sheet which has a thickness of 1.03 millimeters and which is lapped into a thickness of 1.00 millimeter. The stacked sheet thus obtained has a thermal expansion coefficient of 21.8×10⁻⁶/K, a thermal conductivity of 230 W/m·K, and a bonding strength of 3.2 kgf/mm². In addition, the stacked sheet is light in weight because the density is equal to 3.1 g/cm³. A thickness ratio of the aluminum layer to the two molybdenum layers may range from 3:1 to 70:1. In addition, a single molybdenum layer is bonded onto a single surface of the aluminum layer.

The inventors' experiments teach that the stacked sheets manufactured above have the thermal expansion coefficient between 9 and 23×10⁻⁶/K and are suitable for the heat sink used for the plastic-packaged semiconductor devices.

What is claimed is:

1. A plastic-packaged semiconductor device comprising a heat sink, a semiconductor chip on said heat sink, and a plastic package which has a predetermined thermal expansion coefficient and a predetermined thermal conductivity and which covers said heat sink and said semiconductor chip, wherein said heat sink comprises:

a substrate formed by a metal composite material which comprises a mixture of:
a first metal component of a high refractory metal having a first melting point; and
a second metal component having a second melting point lower than said first melting point;

said substrate having a thermal expansion coefficient and a thermal conductivity which are selected in relation to said predetermined thermal expansion coefficient and said predetermined thermal conductivity of said plastic package, and wherein said thermal expansion coefficient of said substrate is between 9.0×10⁻⁶/K and 23.0×10⁻⁶/K and said thermal conductivity of said substrate is not lower than 200 W/m·K.

2. A plastic-packaged semiconductor device as claimed in claim 1, wherein said first metal component is uniformly mixed with said second metal component so as to form said substrate which exhibits said thermal expansion coefficient and said thermal conductivity.

3. A plastic-packaged semiconductor device as claimed in claim 2, wherein said first metal component is formed by a metal component selected from a group consisting of molybdenum, tungsten, and their alloys while said second metal component is formed by copper.

4. A plastic-packaged semiconductor device as claimed in claim 1, wherein said metal composite material is specified by a composition which adds, by weight, 35.0–90% of said second metal component to said first metal component.

5. A plastic-packaged semiconductor device as claimed in claim 1, wherein said substrate is subjected to plasticity processing.

6. A plastic-packaged semiconductor device as claimed in claim 1, wherein said substrate comprises:

a base plate having a principal surface; and a step portion offset from said principal surface and integrated with said base plate.

7. A heat sink for use in a semiconductor device, said heat sink being manufactured by forming a mixture which comprises, by weight, 10–40% of copper and the balance formed by molybdenum, by adding said mixture to 0.05–1.00% of carbon, by weight, to form an added mixture, and by sintering said added mixture.

8. A plastic-packaged semiconductor device having a heat sink, a semiconductor chip on said heat sink, and a plastic package which has a predetermined thermal expansion coefficient and a predetermined thermal conductivity and which covers said heat sink and said semiconductor chip, wherein said heat sink comprises a composite block comprising:

a metal plate of a first metal having a density lower than that of copper; and a mesh member which has a predetermined mesh size and which is buried in said first metal, said mesh member being formed by a second metal having a density heavier than that of copper;

said composite block having a thermal expansion coefficient and a thermal conductivity which are selected in relation to said predetermined thermal expansion coefficient and said predetermined thermal conductivity of said plastic package, and wherein said thermal expansion coefficient of said composite block is between $9.0\times10^{-6}$/K and $23.0\times10^{-6}$/K and said thermal conductivity of said composite block is not lower than 200 W/m·K.

9. A plastic-packaged semiconductor device as claimed in claim 8, wherein said first metal is aluminum while said second metal is molybdenum.

10. A plastic-packaged semiconductor device as claimed in claim 8, wherein said composite block is provided by interposing said mesh member between a pair of metal sheets and by combining said mesh member with said metal sheets which form said metal plate.

11. A plastic-packaged semiconductor device as claimed in claim 10, wherein said mesh member is combined with said metal sheets through a rolling process.

12. A plastic-packaged semiconductor device as claimed in claim 8, wherein said composite block has a thermal expansion coefficient between $10\times10^{-6}$/K and $23\times10^{-6}$/K and a density between 2.0 and 5.0 g·cm$^{-3}$.

13. A plastic-packaged semiconductor device as claimed in claim 8, wherein said predetermined mesh size is equal to 710 microns.

14. A plastic-packaged semiconductor device as claimed in claim 8, wherein said mesh member is formed by a plurality of molybdenum strings each of which has a predetermined diameter.

15. A plastic-packaged semiconductor device as claimed in claim 14, wherein said predetermined diameter is equal to 0.450 millimeter.

16. A plastic-packaged semiconductor device having a heat sink, a semiconductor chip on said heat sink, and a plastic package which has a predetermined thermal expansion coefficient and a predetermined thermal conductivity and which covers said heat sink and said semiconductor chip, wherein said heat sink is formed by a stacked sheet comprising:

a sintered sheet which comprises a mixture of a first metal of a first melting point and a second metal of a second melting point lower than said first melting point and which has front and back surfaces opposite to each other and a side surface contiguous to said front and back surfaces; and a coated layer which is coated on at least said front and said back surfaces of the sintered sheet and which is composed of a selected one of said first and said second metals;

said stacked sheet having a thermal expansion coefficient and a thermal conductivity which are selected in relation to said predetermined thermal expansion coefficient and said predetermined thermal conductivity of said plastic package, and wherein said thermal expansion coefficient of said stacked sheet is between $9.0\times10^{-6}$/K and $23.0\times10^{-6}$/K and said thermal conductivity of said stacked sheet is not lower than 200 W/m·K.

17. A plastic-packaged semiconductor device as claimed in claim 16, wherein said first metal is formed by a metal selected from a group consisting of molybdenum, tungsten, and their alloys while said second metal is formed by copper.

18. A plastic-packaged semiconductor device as claimed in claim 16, wherein said selected one of the first and the second metals is the second metal.

19. A plastic-packaged semiconductor device as claimed in claim 18, wherein said second metal is copper.

20. A plastic-packaged semiconductor device as claimed in claim 16, wherein said selected one of the first and the second metals is the first metal.

21. A plastic-packaged semiconductor device as claimed in claim 20, wherein said first metal is molybdenum.

22. A plastic-packaged semiconductor device as claimed in claim 16, wherein said sintered sheet comprises molybdenum and copper as the first and the second metals, respectively.

23. A plastic-packaged semiconductor device as claimed in claim 16, wherein said sintered sheet comprises tungsten and copper as the first and the second metals, respectively.

24. A plastic-packaged semiconductor device as claimed in claim 23, wherein said sintered sheet comprises, by weight 84% of copper and 16% of tungsten.

25. A plastic-packaged semiconductor device as claimed in claim 16, wherein said stacked sheet has a thermal expansion coefficient between $9.0\times10^{-6}$/K and $23.0\times10^{-6}$/K and a thermal conductivity between 200 and 300 (W/m·K).

26. A plastic-packaged semiconductor device as claimed in claim 16, wherein a thickness ratio between the sintered sheet and the coated layer falls within a range of 3:1 and 70:1.

27. A plastic-packaged semiconductor device having a heat sink, said device comprising a heat sink, a semiconductor chip on said heat sink, and a plastic package which has a predetermined thermal expansion coefficient and a predetermined thermal conductivity and which covers said heat sink and said semiconductor chip, wherein said heat sink is formed by a stacked sheet comprising:

an aluminum sheet having front and back surfaces opposite to each other;

a first molybdenum sheet attached to said front surface of the aluminum sheet; and a second molybdenum sheet attached to said back surface of the aluminum sheet;

said stacked sheet having a thermal expansion coefficient and a thermal conductivity which are selected in relation to said predetermined thermal expansion coefficient and said predetermined thermal conductivity of said plastic package, and wherein said thermal expansion coefficient of said stacked sheet is between $9.0 \times 10^{-6}/K$ and $23.0 \times 10^{-6}/K$ and said thermal conductivity of said stacked sheet is not lower than 200 W/m·K.

28. A heat sink as claimed in claim 27, wherein said stacked sheet has a thermal expansion coefficient between $12.0 \times 10^{-6}/K$ and $22 \times 10^{-6}/K$ and a thermal conductivity not smaller than 200 W/m·K.

29. A heat sink as claimed in claim 28, wherein said stacked sheet further has a bonding strength which is not smaller than 2.0 kgf/mm$^2$.

30. A heat sink as claimed in claim 28, wherein said stacked sheet has a density between 3.0 and 5.0 g/cm$^3$.

31. A heat sink for use in a semiconductor device of a transfer molded type which comprises a heat sink, a semiconductor chip transfer molded by a resin, and a plastic package which has a predetermined thermal expansion coefficient and a predetermined thermal conductivity and which covers said heat sink and said semiconductor chip, wherein said heat sink comprises:

a substrate formed by a metal composite material which comprises a mixture of:
 a first metal component of a high refractory metal having a first melting point; and
 a second metal component having a second melting point lower than said first melting point;

said substrate having a thermal expansion coefficient and a thermal conductivity which are selected in relation to said predetermined thermal expansion coefficient and said predetermined thermal conductivity of said plastic package, and wherein said thermal expansion coefficient of said substrate is between $9.0 \times 10^{-6}/K$ and $23.0 \times 10^{-6}/K$ and said thermal conductivity of said substrate is not lower than 200 W/m·K.

32. A heat sink as claimed in claim 31, wherein said first metal component is uniformly mixed with said second metal component so as to form said substrate which exhibits said thermal expansion coefficient and said thermal conductivity.

33. A heat sink as claimed in claim 32, wherein said first metal component is formed by a metal component selected from a group consisting of molybdenum, tungsten, and their alloys while said second metal component is formed by copper.

34. A heat sink as claimed in claim 33, wherein said metal composite material is specified by a composition which adds, by weight, 35–90% of said second metal component to said first metal component.

35. A plastic package having a heat sink, wherein said plastic package has a predetermined thermal expansion coefficient and a predetermined thermal conductivity, and wherein said heat sink comprises:

a substrate formed by a metal composite material which comprises a mixture of:
 a first metal component of a high refractory metal having a first melting point; and
 a second metal component having a second melting point lower than said first melting point;

said substrate having a thermal expansion coefficient and a thermal conductivity which are selected in relation to said predetermined thermal expansion coefficient and said predetermined thermal conductivity of said plastic package, and wherein said thermal expansion coefficient of said substrate is between $9.0 \times 10^{-6}/K$ and $23.0 \times 10^{-6}/K$ and said thermal conductivity of said substrate is not lower than 200 W/m·K.

36. A plastic-packaged as claimed in claim 35, wherein said first metal component is uniformly mixed with said second metal component so as to form said substrate which exhibits said thermal expansion coefficient and said thermal conductivity.

37. A plastic package as claimed in claim 36, wherein said first metal component is formed by a metal component selected from a group consisting of molybdenum, tungsten, and their alloys while said second metal component is formed by copper.

38. A plastic package as claimed in claim 37, wherein said metal composite material is specified by a composition which adds, by weight, 35–90% of said second metal component to said first metal component.

* * * * *

UNITED STATES PATENT AND TRADEMARK OFFICE
CERTIFICATE OF CORRECTION

PATENT NO. : 5,493,153
DATED : February 20, 1996
INVENTOR(S) : Tadashi Arikawa, et al.

It is certified that error appears in the above-indentified patent and that said Letters Patent is hereby corrected as shown below:

| | | |
|---|---|---|
| Column 9, | line 10, | delete "ability". |
| Column 10, | line 2, | after "integrate them" insert --into--; |
| | lines 11-12, | delete "micronmeters" and insert --microns--; |
| | line 18, | delete "micronmeter" and insert --microns--; |
| | line 21, | delete "in" and insert --is--; |
| | line 50, | delete "micronmeter" and insert --micron--. |
| Column 11, | line 40, | before "mixed powder" insert --a--; |
| | line 59, | delete "micronmeters" and insert --microns--; |
| | line 62, | delete "micronmeter" and insert --microns--; |
| | line 66, | after "the form of" insert --a--. |
| Column 12, | line 11, | delete "micronmeters" and insert --microns--; |
| | line 29, | delete "micronmeters" and insert --microns--; |
| | line 45, | delete "micronmeters" and insert --microns--; |
| | line 61, | delete "micronmeters" and insert --microns--. |
| Column 13, | line 34, | after "made about" insert --the--; |
| | line 47, | delete "micronmeters" and insert --microns--; |
| | lines 49-50, | delete "micronmeter" and insert --microns--; |
| | line 57, | delete "millimeter" and insert therefor --millimeters--. |

UNITED STATES PATENT AND TRADEMARK OFFICE
CERTIFICATE OF CORRECTION

PATENT NO. : 5,493,153
DATED : February 20, 1996
INVENTOR(S) : Tadashi Arikawa, et al.

It is certified that error appears in the above-indentified patent and that said Letters Patent is hereby corrected as shown below:

Column 14, line 23, delete "micronmeters" and insert --microns--.

Signed and Sealed this

Third Day of September, 1996

*Attest:*

BRUCE LEHMAN

*Attesting Officer*     *Commissioner of Patents and Trademarks*